US008136056B2

(12) United States Patent
Scheffer et al.

(10) Patent No.: US 8,136,056 B2
(45) Date of Patent: Mar. 13, 2012

(54) METHOD AND SYSTEM FOR INCORPORATION OF PATTERNS AND DESIGN RULE CHECKING

(75) Inventors: Louis K. Scheffer, Campbell, CA (US); David C. Noice, Palo Alto, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 302 days.

(21) Appl. No.: 11/437,320

(22) Filed: May 19, 2006

(65) Prior Publication Data

US 2007/0006114 A1 Jan. 4, 2007

Related U.S. Application Data

(60) Provisional application No. 60/683,367, filed on May 20, 2005.

(51) Int. Cl.
*G06F 17/50* (2006.01)
(52) U.S. Cl. ........... 716/52; 716/51; 716/53; 716/54; 716/55; 716/56
(58) Field of Classification Search ............ 716/4, 5, 716/19, 20, 21, 51, 52, 53, 54, 55, 56, 106, 716/108, 110, 111, 112, 113; 438/5, 30
See application file for complete search history.

(56) References Cited

U.S. PATENT DOCUMENTS

| | | | | |
|---|---|---|---|---|
| 5,706,295 A | * | 1/1998 | Suzuki | 714/724 |
| 6,507,930 B1 | * | 1/2003 | Bass et al. | 716/2 |
| 6,553,548 B1 | * | 4/2003 | Hekmatpour | 716/5 |
| 6,952,818 B2 | * | 10/2005 | Ikeuchi | 430/311 |
| 7,124,386 B2 | | 10/2006 | Smith et al. | |
| 7,152,215 B2 | | 12/2006 | Smith et al. | |
| 7,174,520 B2 | | 2/2007 | White et al. | |
| 7,243,316 B2 | | 7/2007 | White et al. | |
| 7,325,206 B2 | | 1/2008 | White et al. | |
| 7,353,475 B2 | | 4/2008 | White et al. | |
| 7,356,783 B2 | | 4/2008 | Smith et al. | |
| 7,360,179 B2 | | 4/2008 | Smith et al. | |
| 7,363,099 B2 | | 4/2008 | Smith et al. | |
| 7,363,598 B2 | | 4/2008 | Smith et al. | |
| 7,367,008 B2 | | 4/2008 | White et al. | |
| 7,380,220 B2 | | 5/2008 | Smith et al. | |

(Continued)

OTHER PUBLICATIONS

International Search Report and Written Opinion dated May 8, 2007 for Appl. No. PCT/US2006/019509.

*Primary Examiner* — Thuan Do
*Assistant Examiner* — Nha Nguyen
(74) *Attorney, Agent, or Firm* — Vista IP Law Group, LLP

(57) ABSTRACT

Methods and systems for representing the limitations of a lithographic process using a pattern library instead of, or in addition to, using design rules. The pattern library includes "known good" patterns, which chip fabricators know from experience are successful, and "known bad" patterns, which chip fabricators know to be unsuccessful. The pattern library can be used to contain exceptions to specified design rules, or to replace the design rules completely. In some implementations, the pattern library contains statistical information that is used to contribute to an overall figure of merit for the design. In other implementations, a routing tool may generate a plurality of possible IC layouts, and select one IC layout based on information contained in the pattern library.

41 Claims, 5 Drawing Sheets

U.S. PATENT DOCUMENTS

| | | |
|---|---|---|
| 7,383,521 B2 | 6/2008 | Smith et al. |
| 7,393,755 B2 | 7/2008 | Smith et al. |
| 2002/0152453 A1* | 10/2002 | Rittman .................. 716/21 |
| 2003/0115569 A1* | 6/2003 | Ikeuchi .................. 716/19 |
| 2005/0037522 A1 | 2/2005 | Smith et al. |
| 2005/0051809 A1 | 3/2005 | Smith et al. |
| 2005/0076323 A1* | 4/2005 | Gau et al. .............. 716/21 |
| 2005/0132306 A1 | 6/2005 | Smith et al. |
| 2005/0196964 A1 | 9/2005 | Smith et al. |
| 2005/0235246 A1 | 10/2005 | Smith et al. |
| 2005/0268256 A1* | 12/2005 | Tsai et al. .............. 716/4 |
| 2006/0090146 A1* | 4/2006 | LeBritton et al. ........ 716/4 |
| 2007/0101305 A1 | 5/2007 | Smith et al. |
| 2007/0256039 A1 | 11/2007 | White |
| 2008/0027698 A1 | 1/2008 | White |
| 2008/0160646 A1 | 7/2008 | White et al. |
| 2008/0162103 A1 | 7/2008 | White et al. |
| 2008/0163139 A1 | 7/2008 | Scheffer et al. |
| 2008/0163141 A1 | 7/2008 | Scheffer et al. |
| 2008/0163142 A1 | 7/2008 | White et al. |
| 2008/0163148 A1 | 7/2008 | Scheffer et al. |
| 2008/0163150 A1 | 7/2008 | White et al. |
| 2008/0216027 A1 | 9/2008 | White et al. |
| 2009/0031261 A1 | 1/2009 | Smith et al. |
| 2009/0031271 A1 | 1/2009 | White et al. |

* cited by examiner

METHOD AND SYSTEM FOR INCORPORATION OF PATTERNS AND DESIGN RULE CHECKING

RELATED APPLICATION

The present application claims the benefit of U.S. Provisional Application No. 60/683,367, filed May 20, 2005, the entire disclosure of which is hereby incorporated by reference herein.

BACKGROUND

Current circuit design and layout systems include rules-checking systems that include rules related to, among other things, line spacing, line widths and generic rules regarding geometric relationships between lines. These rules are generally restricted to single elements and relationships between two neighboring elements.

Because of light spreading effects through lenses and masks during fabrication of circuits, the each element can have an impact on more than just its neighboring elements. Currently, design or analysis systems or methods do not sufficiently or effectively take these non-neighboring impacts into account. What is needed is a method and system capable or identifying and/or compensating for the effects of non-neighboring elements on circuit design and layout.

SUMMARY

Methods and systems for representing the limitations of a lithographic process include using a pattern library instead of, or in addition to, using design rules. The pattern library includes "known good" patterns, which chip fabricators know from experience are successful, and "known bad" patterns, which chip fabricators know to be unsuccessful. The pattern library can be used to contain exceptions to specified design rules, or to replace the design rules completely. In some implementations, the pattern library contains statistical information that is used to contribute to an overall figure of merit for the design. In other implementations, a routing tool may generate a plurality of possible IC layouts, and select one IC layout based on information contained in the pattern library In one embodiment, a method for analyzing the suitability of an Integrated Circuit (IC) layout for manufacture includes receiving an IC layout, consulting a pattern library, and analyzing the IC layout based on the pattern library. The method further includes making a determination, based on the analysis, of the suitability of the IC layout for manufacture.

DETAILED DESCRIPTION

Figure 1:
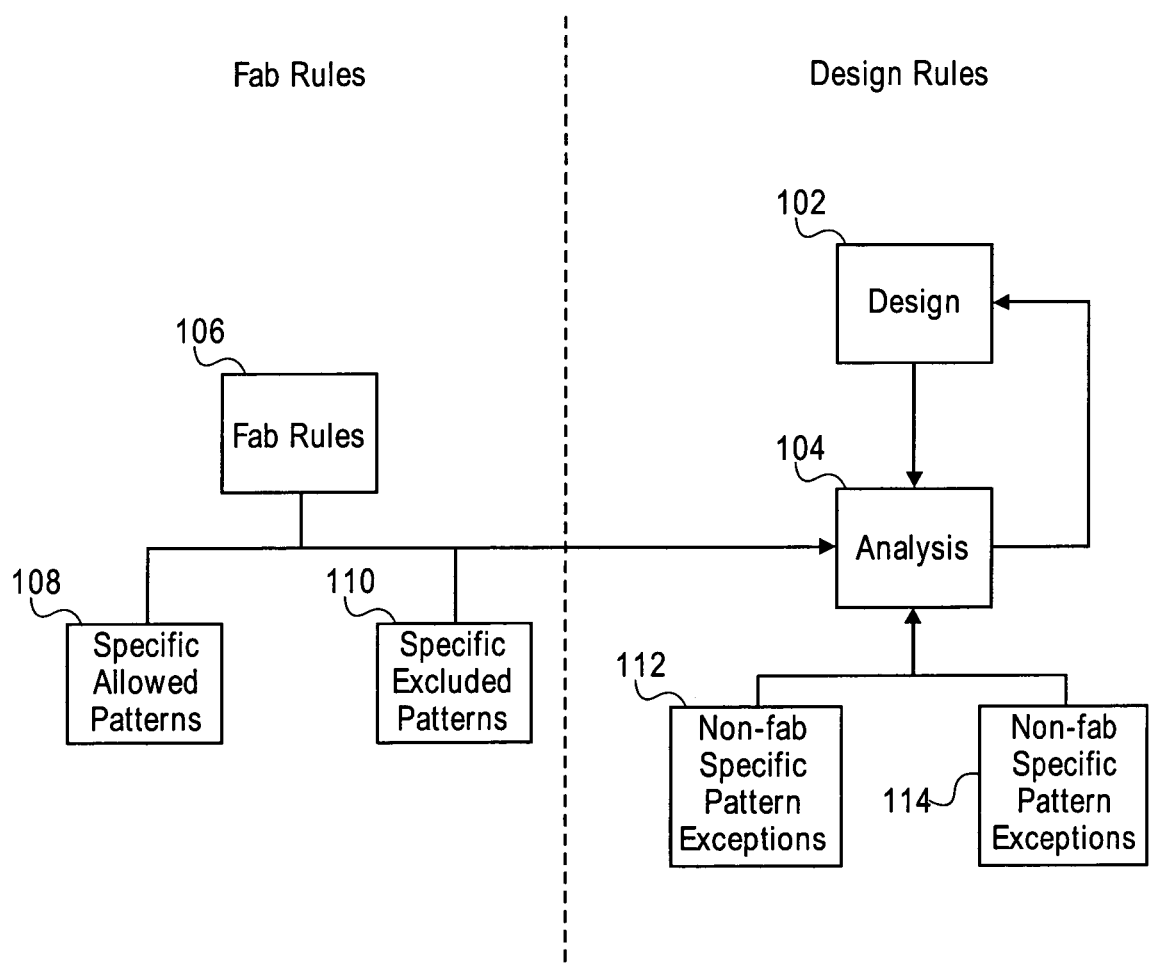
FIG. 1 depicts a flow diagram of a method of identifying and/or compensating for the effects of non-neighboring elements.

Typically, fabrication labs use rules to communicate the limits of the fabrication process to chip designers. A fabrication lab specifies a plurality of design rules, and guarantees that a chip can be produced if the chip does not violate the design rules.

In the past, design rules used to be relatively simple in nature. For example, a design rule might specify that the minimum line width was 100 nm. However, as geometries shrink, the rules become more difficult to express. For example, a design rule for use with smaller geometries might specify that for a line with a width of 40 nm, after a 90 degree turn, the line width should be 35 nm.

Increasingly, design rules are becoming a cumbersome way to express the limits of the fabrication process. Furthermore, from experience in the field, chip fabricators know about patterns, or groups of elements, that work well in fabrication, and other patterns that do not work well in fabrication. In many cases, fabricators know of patterns that work well in spite of design rules that indicate that the pattern should fail. These may be referred to as "known good" patterns. In other cases, fabricators know of patterns that fail in spite or design rules that indicate that the patterns should work well. These may be referred to as "known bad" patterns.

In order to communicate their practical knowledge to chip designers, chip fabricators will frequently create design rules that are intended only to include or exclude a certain known pattern. These rules may be cumbersome to express and may have unintended consequences, in that they may unintentionally include or exclude other patterns, combinations, or circuit components.

Accordingly, embodiments of the invention provide for an explicit way for a chip fabricator to specify known good and known bad patterns. The known good and known bad patterns may be placed into a data store, such as a fabrication pattern library. In one implementation, the fabrication pattern library may be used in conjunction with design rules in order to specify the limitations of the fabrication process, and to allow a designer to design a chip. In another implementation, the fabrication pattern library may be used alone as the sole means to specify the limitations of the fabrication process. In this case, no design rules may be specified.

Furthermore, in another implementation, an application-specific pattern library (also referred to as a non-fabrication pattern library) may be provided. For example, in a chip in which timing is crucial, some patterns may be excluded from the chip for poor timing performance, even though they would ordinarily be allowed. As another example, in a chip in which power loss is not crucial, some patterns may be included in the chip, even though they would ordinarily not be allowed due to relatively high power loss. The application-specific pattern library may be used in conjunction with the fabrication pattern library and/or with the design rules in order to specify the limitations for a particular chip.

FIG. 1 depicts a flow diagram of a method of identifying and/or compensating 100 for the effects of non-neighboring elements. In step 102, the design process for both electrical and layout can be completed. The process includes determining relative sizes and locations of specific electrical components, interconnect lines, vias and/or any other elements which are to be included on the circuit. This process can be performed using any known and/or convenient design and layout techniques.

In step 104 the design can be verified by any known and/or convenient analysis tool. The analysis tools can evaluate the design for compliance with various physical and/or constraints. These constraints can be in the form of limitations and/or in the form of statistical/predicted outcome design constraints, such as is described in U.S. patent application Ser. No. 11/437,600, entitled SYSTEM AND METHOD FOR STATISTICAL DESIGN RULE CHECKING, filed on even date herewith, the complete contents of which are incorporated herein by reference in its entirety. In some embodiments, any known and/or convenient design constraints can be used. During the analysis step 104, the system determines if the design created in step 102 meets the various design constraints based on a predetermined set of rules. In embodiments, these analysis rules can be user modifiable.

In step 106, fabrication rules can be generated based on the capabilities of equipment which will be used to manufacture the circuit and/or based on experience in fabrication of other circuits. The fabrication rules can be related to, for example, interconnect line spacing, interconnect line width, via locations, via dimensions, via spacing, locations of specific electrical components, and/or the relative geometries and/or locations of any of elements contained on the circuit. In some embodiments, the fabrication rules can be a predefined set of rules which are user modifiable.

In step 108, specific allowed exceptions, which may not satisfy the fabrication rules but result in acceptable results, can be established. In some embodiments, the allowed exceptions can be related to geometric patterns of more than two elements within a circuit, specific patterns of two elements within a circuit, and/or any other exception related to elements of the circuit. The allowed exceptions can be based on previous fabrication experience of circuit layouts which may have violated the fabrication rules, but otherwise resulted in a satisfactorily functioning circuit. The allowed exceptions can be generated either manually or in an automated manner and can be user modifiable.

In step 110, specific disallowed exceptions, which may satisfy the fabrication rules but result in unacceptable results, can be established. In some embodiments, the disallowed exceptions can relate to geometric patterns of more than two elements within a circuit, specific patterns of two elements within a circuit, and/or any other exception related to elements of the circuit. The disallowed exceptions can be based on previous fabrication experience of circuit layouts which may not have violated the fabrication rules, but otherwise resulted in an unsatisfactorily functioning circuit. The disallowed exceptions can be generated either manually or in an automated manner and can be user modifiable.

In step 112, specific allowed non-fab exceptions, which may not satisfy the analysis rules but result in acceptable results, can be established. These exceptions may be established at any organizational level, such as for example, company-wide exception, project-based exceptions, user-specific exceptions, or government-based exceptions. In some embodiments, the allowed non-fab exceptions can be related to geometric patterns of more than two elements within a circuit, specific patterns of two elements within a circuit, any other exception related to elements of the circuit and/or requirements imposed on the circuit design by a vendor, client and/or design company. The allowed non-fab exceptions can be based on previous fabrication experience of circuit layouts which may have violated the analysis rules, but otherwise resulted in a satisfactorily functioning circuit. The allowed non-fab exceptions can be generated either manually or in an automated manner and can be user modifiable.

In step 114, specific disallowed non-fab exceptions, which may satisfy the analysis rules but result in unacceptable results, can be established. As before, these non-fab exceptions may be established at any organizational level. In some embodiments, the disallowed non-fab exceptions can relate to geometric patterns of more than two elements within a circuit, specific patterns of two elements within a circuit, any other exception related to elements of the circuit and/or requirements imposed on the circuit design by a vendor, client and/or design company. The disallowed non-fab exceptions can be based on previous fabrication experience of circuit layouts which may not have violated the fabrication rules, but otherwise resulted in an unsatisfactorily functioning circuit. The disallowed exceptions can be generated either manually or in an automated manner and can be user modifiable.

In operation, the fabrication rules 106, specific allowed exception 108, specific disallowed exceptions 110, specific allowed non-fab exceptions 112 and specifically disallowed non-fab exceptions, or any combination thereof, can be combined with analysis rules in the analysis step 104 to determine if a design 102 is satisfactory.

If, in step 104, it is determined that the design does not satisfy the analysis and/or exception rules, the proposed design can be rejected or be returned to the design process 102, where the elements not meeting the design constraints can be identified for further processing. In some embodiments, the analysis step 104 can provide a listing or elements not meeting design criteria and/or identify the specific design rules or design criteria not satisfied.

Additional Features

In some embodiments, the patterns may not be strictly forbidden or allowed. Instead they may contribute to a figure of merit, such as the overall chance of the chip working, or the allowable process window, or any other convenient and/or desired characteristic. At the completion of design rule checking, these attributes may be reported in addition to, or instead of, the traditional list of detected errors. An approach that may be used to determine whether a pattern might not be totally forbidden or totally allowed; and instead might contribute to the chip yield (or other measures of adequacy, suitability, or acceptance) in a statistical sense is described in U.S. patent application Ser. No. 11/437,600, entitled SYSTEM AND METHOD FOR STATISTICAL DESIGN RULE CHECKING, filed on even date herewith, the complete contents of which are incorporated herein by reference in its entirety.

Furthermore, in some embodiments, a pattern in a design need not exactly match a pattern in the pattern library. Instead, "fuzzy matching" or "approximate matching" may be used, in which case a pattern in a design is considered to match a pattern in the pattern library if the patterns are determined to be relatively similar. One example of such approximate matching may be based on the number of similar pixels. For example, a design pattern may be considered to be an approximate match to a pattern in the pattern library if a predetermined number of pixels, such as 95%, are identical between the two patterns. Another example of approximate matching may use the number and length of edges and corners in the patterns. For example, a design pattern may be considered to be an approximate match to a pattern in the library if 90% of the edges and/or corners in the design pattern are within 5 nm of the edges and/or corners in the pattern in the library. In order to determine whether a design pattern is an approximate match, the design pattern and the pattern in the library may be examined to see if they would be manufactured in a substantially similar fashion. As one particular example, the displacement of edges and corners required to make the design pattern exactly match the pattern in the library could be calculated, and it could then be determined whether the maximum and/or average displacement exceeds a minimum threshold. Other methods for fuzzy or approximate matching will occur to those skilled in the art.

In addition, in some embodiments, a known bad pattern may be associated with a known good pattern in the pattern library. The known bad pattern and the known good pattern may have identical or similar electrical characteristics, and when the known bad pattern is detected in a design, it may be replaced with the known good pattern. The association of the known bad pattern with the known good pattern may be made, for example, by a chip fabricator or a chip designer based on experience. Alternatively, as designs containing known bad patterns are corrected using the pattern library and method of FIG. 1, the correction could be used to create an association. Such an association could be made automatically, or with user input.

Exemplary Process Flow

Figure 1B:
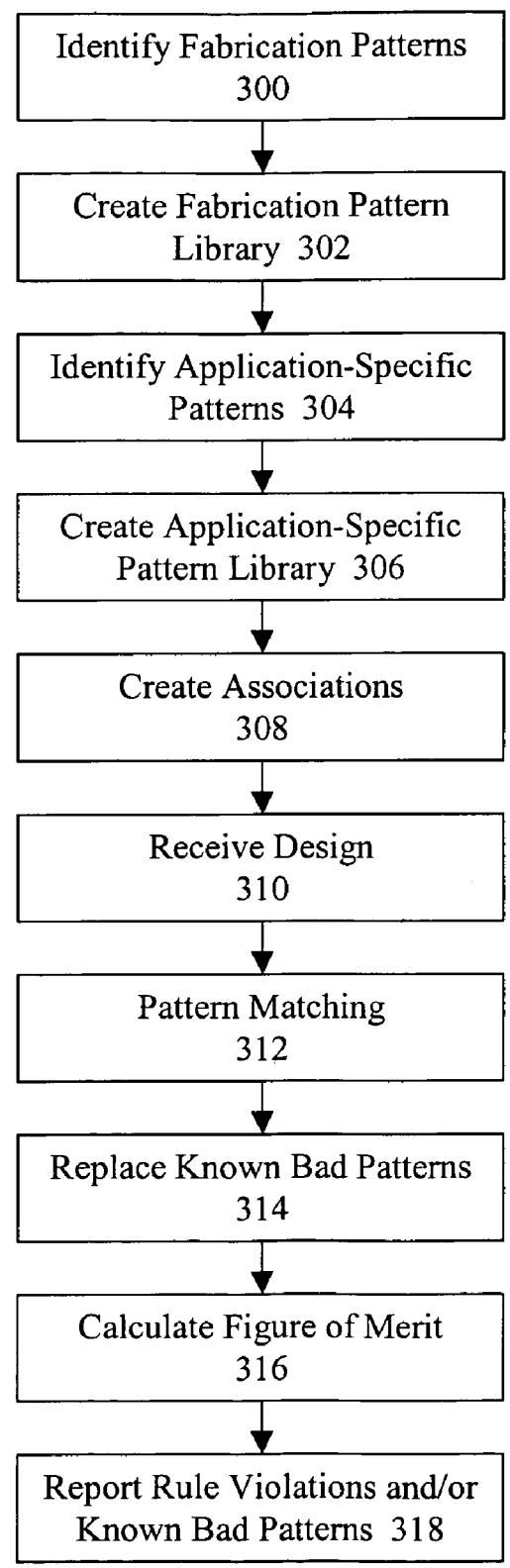
FIG. 1*b* depicts a flow diagram of a method for chip design and fabrication using a pattern library.

An example demonstrating use of a pattern library will now be described with reference to FIGS. 1b-1e. As shown in FIG. 1b, a method for using a pattern library may begin in step 300, in which one or more fabrication patterns may be identified. The fabrication patterns may be identified, for example, by chip fabricators based on experience or simulation. The fabrication patterns may be identified as "known good" or "known bad" patterns. Alternatively or in addition, the fabrication patterns may be associated with one or more statistics, such as, for example, the probability of the pattern functioning properly, expected timing properties for the pattern, expected electrical properties for the pattern (such as capacitance, resistance, or inductance), or other appropriate statistics.

In step 302, the identified patterns may be placed in a fabrication pattern library or other appropriate data store. Within the fabrication pattern library or other data store, the pattern may be identified as a "known good" or "known bad" pattern. Alternatively or in addition, statistics associated with the pattern may be stored in the pattern library or other data store. The statistics stored in the pattern library or other data store may include, for example, the probability of the pattern functioning properly, expected timing properties for the pattern, expected electrical properties for the pattern (such as capacitance, resistance, or inductance), or other appropriate statistics.

Figure 1C:
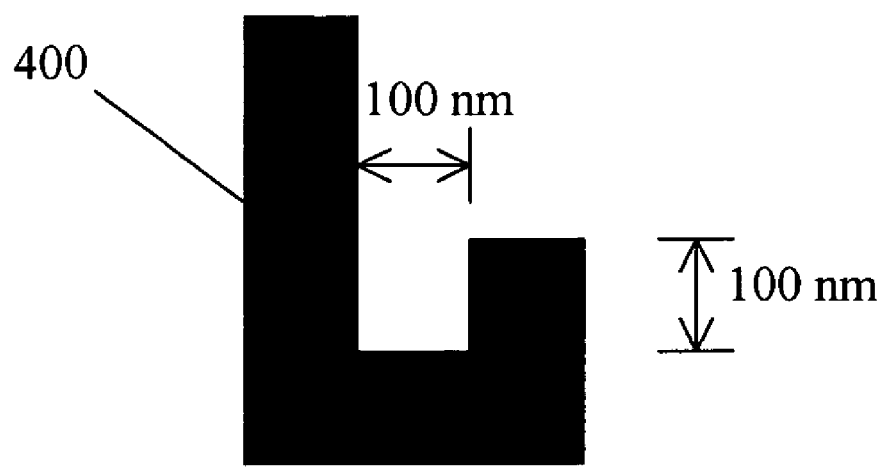
FIG. 1*c* depicts a "known bad" pattern.

An example of a known bad pattern 400 is shown in FIG. 1c. Design rules may specify, for example, that the minimum width and minimum spacing for a design are 100 nm. However, chip fabricators may know, from experience or simulation, that even though pattern 400 satisfies the minimum width and minimum spacing rules, pattern 400 prints poorly due to the lithography process, and therefore fails to function in some cases. Pattern 400 may therefore be a known bad pattern. Pattern 400 may be saved to the pattern library or other data store as a known bad pattern. Alternatively or in addition, the pattern 400 may be stored along with statistics describing the pattern. For example, the pattern 400 may be stored along with statistics specifying that the pattern functions properly 98% of the time. This figure may then be used to contribute to an overall probability of success or other figure of merit.

Figure 1D:
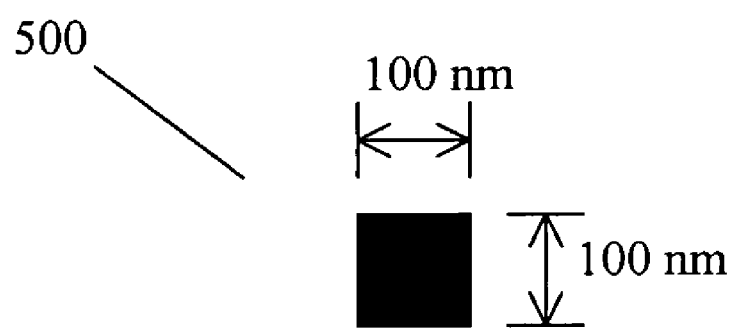
FIG. 1*d* depicts a "known good" pattern.

An example of a known good pattern 500 is shown in FIG. 1d. Design rules may specify, for example, that the minimum area for a circuit component is 20,000 nm$^2$. However, chip fabricators may know, from experience or simulation, that even though pattern 500 violates the minimum area rule, pattern 500 prints well, and is particularly useful for creating stacked vias. Pattern 500 may therefore be a known good pattern. Pattern 500 may be saved to the pattern library or other data store as a known good pattern. Alternatively or in addition, the pattern 500 may be stored along with statistics describing the pattern. For example, the pattern 500 may be stored along with statistics specifying that the pattern functions properly 99.9996% of the time. This figure may then be used to contribute to an overall probability of success or other figure of merit.

In step 304, application-specific patterns may be identified, and in step 306, the application-specific patterns may be placed in an application-specific pattern library. Steps 304 and 306 may proceed in a similar manner to steps 300 and 302, respectively. However, the application-specific patterns may be evaluated based on criteria specific to the application. For example, the patterns may be classified as "known good" or "known bad" based on application-specific criteria, such as more stringent or more relaxed power usage criteria, more stringent or more relaxed timing criteria, more stringent or more relaxed probability of success (which may be adjusted based on more stringent or more relaxed expectations of the yield), and the like.

In step 308, associations may be created. Step 308 may be performed, for example, in an implementation in which known bad patterns will be replaced by known good patterns. The associations created may link a known bad pattern, such as the known bad pattern 400, to a known good pattern that servers exactly or substantially the same function (not shown). The associations may be created, for example, by chip fabricators based on experience, or as a result of performing a redesign after a design with a known bad pattern is found. Alternatively, step 308 may be skipped in some implementations.

In step 310, a design may be received, for example, from a designer. In step 312, pattern matching may be performed, to match patterns in the design to patterns in the pattern libraries. The pattern matching performed may be exact pattern, or may be "fuzzy" or "approximate" pattern matching, as discussed above.

In step 314, known bad patterns may be replaced, for example, with known good patterns. Step 314 may be performed in implementations where associations have been created between known bad patterns and known good patterns of the same or similar functions. Alternatively, step 314 may be skipped in some implementations.

In step 316, one or more figures of merit may be calculated, for example, based on statistics in the pattern libraries. The figures of merit may be used to determine whether the overall design is acceptable based on some design parameters, or to determine whether portions of the design are acceptable based on some design parameters. Alternatively, step 316 may be skipped in some implementations.

In step 318, rule violations and/or known bad patterns could be reported. For example, the rule violations and/or known bad patterns that are present in the design could be reported to a chip designer. Based on the information reported, the chip designer could perform a redesign, or could modify the original design. Alternatively, the design could be accepted.

Figure 1E:
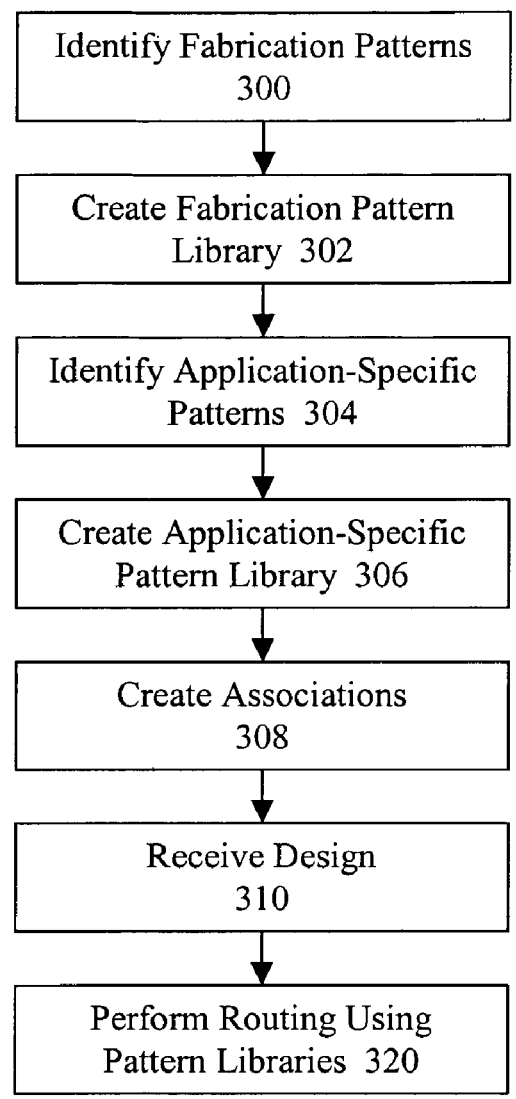
FIG. 1*e* depicts a flow diagram of a method for using a pattern library in conjunction with a routing tool.

As shown in FIG. 1e, a method for using a pattern library in conjunction with a routing tool may include steps 300-310 as described above. In step 320, a routing tool may perform routing using the pattern library or pattern libraries, and optionally using one or more design rules. In performing the routing, the routing tool may attempt to avoid known bad patterns whenever possible. The routing tool may not attempt to avoid known good patterns, and the routing tool may also attempt to conform to one or more rules. If the routing tool is not able to avoid using a known bad pattern, a designer may be presented with a notification. The designer may select to perform a redesign or to make corrections to the original design based on the notification. Alternatively or in addition, the routing tool may attempt to optimize or improve one or more parameters, as determined by the statistics stored in the pattern libraries.

Although the invention has been described in terms of using a fabrication pattern library and an application-specific pattern library, either of these libraries could be used alone, or the libraries could be merged. Furthermore, while the invention has been generally described in terms of patterns that are used in conjunction with design rules, the patterns could be used without design rules. In this case, the pattern library and associated information may be the only information that is used to communicate the limitations of the fabrication process to the chip designers. Other modifications will occur to those skilled in the art.

System Architecture

Figure 2:
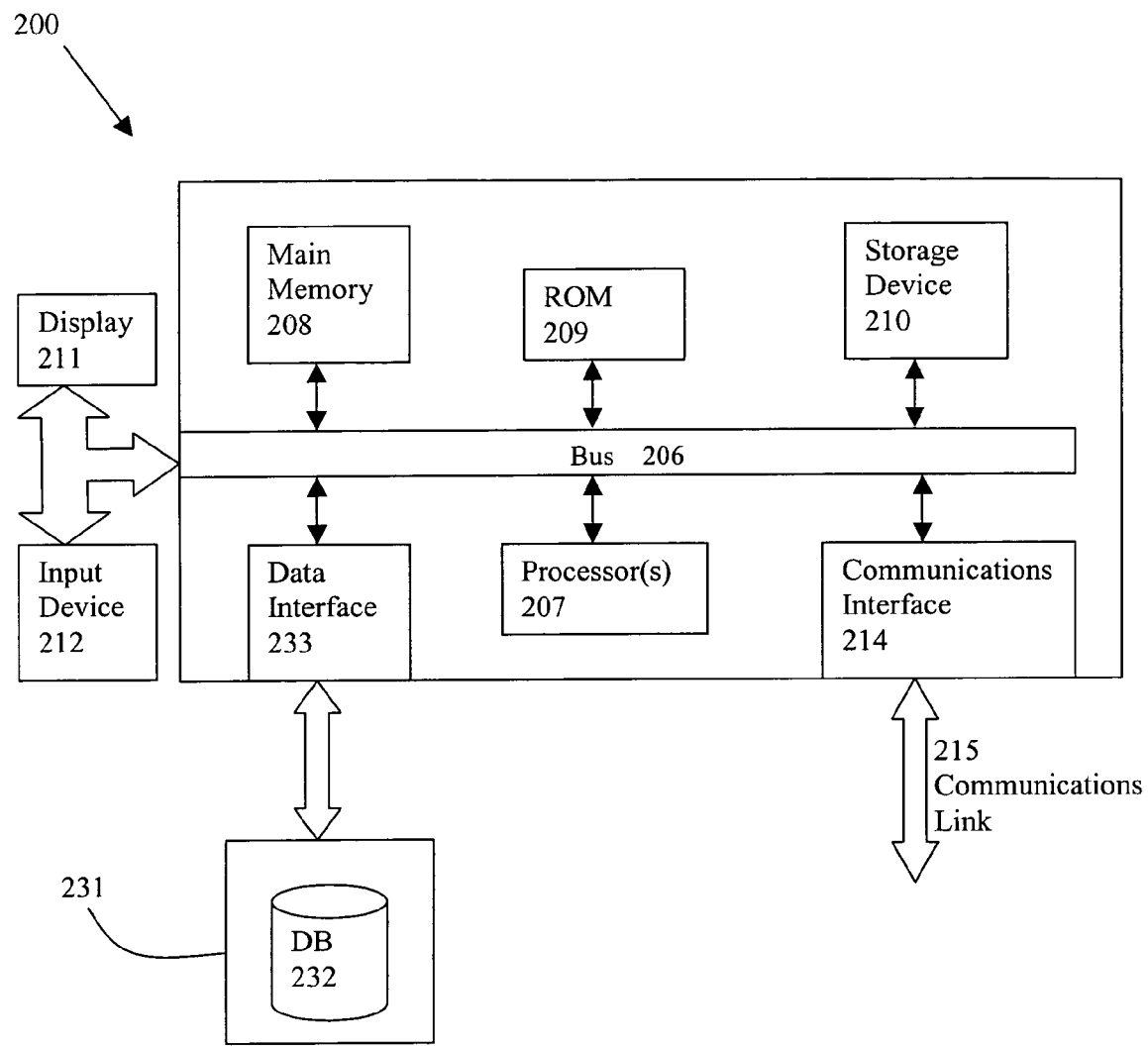
FIG. 2 depicts a computerized system on which a method for design rule checking and IC routing can be implemented.

The execution of the sequences of instructions required to practice the embodiments may be performed by a computer system 200 as shown in FIG. 2. In an embodiment, execution of the sequences of instructions is performed by a single computer system 200. According to other embodiments, two or more computer systems 200 coupled by a communication link 215 may perform the sequence of instructions in coordination with one another. Although a description of only one computer system 200 will be presented below, however, it should be understood that any number of computer systems 200 may be employed to practice the embodiments.

A computer system 200 according to an embodiment will now be described with reference to FIG. 2, which is a block diagram of the functional components of a computer system 200. As used herein, the term computer system 200 is broadly used to describe any computing device that can store and independently run one or more programs.

Each computer system 200 may include a communication interface 214 coupled to the bus 206. The communication interface 214 provides two-way communication between computer systems 200. The communication interface 214 of a respective computer system 200 transmits and receives electrical, electromagnetic or optical signals, that include data streams representing various types of signal information, e.g., instructions, messages and data. A communication link 215 links one computer system 200 with another computer system 200. For example, the communication link 215 may be a LAN, in which case the communication interface 214 may be a LAN card, or the communication link 215 may be a PSTN, in which case the communication interface 214 may be an integrated services digital network (ISDN) card or a modem, or the communication link 215 may be the Internet, in which case the communication interface 214 may be a dial-up, cable or wireless modem.

A computer system 200 may transmit and receive messages, data, and instructions, including program, i.e., application, code, through its respective communication link 215 and communication interface 214. Received program code may be executed by the respective processor(s) 207 as it is received, and/or stored in the storage device 210, or other associated non-volatile media, for later execution.

In an embodiment, the computer system 200 operates in conjunction with a data storage system 231, e.g., a data storage system 231 that contains a database 232 that is readily accessible by the computer system 200. The computer system 200 communicates with the data storage system 231 through a data interface 233. A data interface 233, which is coupled to the bus 206, transmits and receives electrical, electromagnetic or optical signals, that include data streams representing various types of signal information, e.g., instructions, messages and data. In embodiments, the functions of the data interface 233 may be performed by the communication interface 214.

Computer system 200 includes a bus 206 or other communication mechanism for communicating instructions, messages and data, collectively, information, and one or more processors 207 coupled with the bus 206 for processing information. Computer system 200 also includes a main memory 208, such as a random access memory (RAM) or other dynamic storage device, coupled to the bus 206 for storing dynamic data and instructions to be executed by the processor(s) 207. The main memory 208 also may be used for storing temporary data, i.e., variables, or other intermediate information during execution of instructions by the processor(s) 207.

The computer system 200 may further include a read only memory (ROM) 209 or other static storage device coupled to the bus 206 for storing static data and instructions for the processor(s) 207. A storage device 210, such as a magnetic disk or optical disk, may also be provided and coupled to the bus 206 for storing data and instructions for the processor(s) 207.

A computer system 200 may be coupled via the bus 206 to a display device 211, such as, but not limited to, a cathode ray tube (CRT), for displaying information to a user. An input device 212, e.g., alphanumeric and other keys, is coupled to the bus 206 for communicating information and command selections to the processor(s) 207.

According to one embodiment, an individual computer system 200 performs specific operations by their respective processor(s) 207 executing one or more sequences of one or more instructions contained in the main memory 208. Such instructions may be read into the main memory 208 from another computer-usable medium, such as the ROM 209 or the storage device 210. Execution of the sequences of instructions contained in the main memory 208 causes the processor(s) 207 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 207. Such a medium may take many forms, including, but not limited to, non-volatile and volatile. Non-volatile media, i.e., media that can retain information in the absence of power, includes the ROM 209, CD ROM, magnetic tape, and magnetic discs. Volatile media, i.e., media that can not retain information in the absence of power, includes the main memory 208.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than restrictive sense.

What is claimed is:

1. A computer-implemented method for analyzing suitability of an Integrated Circuit (IC) layout for manufacture, comprising:
using a computer system which comprises at least one processor and is configured for:
receiving an IC layout;
performing design rules checking (DRC) using design rules on the IC layout to generate a DRC result;
consulting a pattern library, wherein the pattern library comprises at least a pattern that corresponds to one or more patterns in the IC layout and statistics associated with a probability that the pattern will function as designed after manufacturing;

analyzing the IC layout based at least in part upon the DRC result and the pattern to determine one or more exceptions to the design rule, wherein the act of analyzing the IC layout comprises determining an impact on a component in the IC layout caused by at least one non-neighboring circuit component of the component, which is not neighboring the component;

making a determination, based at least in part upon the act of analyzing the IC layout and the pattern, of the suitability of the IC layout for manufacture, wherein the act of making the determination comprises: performing statistical analysis using at least in part the one or more exceptions and the statistics to determine whether the manufactured IC layout is suitable; and storing the determination of the suitability of the IC layout for manufacture in a volatile or non-volatile computer usable storage medium or displaying the determination on a display device.

2. The method of claim 1, wherein the pattern library comprises a fabrication pattern library.

3. The method of claim 1, wherein the pattern library comprises an application-specific pattern library.

4. The method of claim 1, wherein consulting the pattern library comprises:
matching a pattern in the IC layout to a pattern in the pattern library.

5. The method of claim 4, wherein matching is exact.

6. The method of claim 4, wherein the matching is approximate.

7. The method of claim 6, wherein the matching comprises:
determining a number of pixels that match between the pattern in the IC layout and the pattern in the library; and
determining whether the number of pixels exceeds a minimum threshold.

8. The method of claim 6, wherein the matching comprises:
determining the displacement of edges and corners required to make the pattern in the IC layout to exactly match the pattern in the pattern library.

9. The method of claim 8, wherein the matching further comprises:
determining whether a maximum displacement exceeds a predetermined minimum threshold.

10. The method of claim 8, wherein the matching further comprises:
determining whether an average displacement exceeds a predetermined minimum threshold.

11. The method of claim 6, wherein matching comprises:
analyzing the pattern in the IC layout and the pattern in the pattern library to determine whether they would be manufactured in a substantially similar fashion.

12. The method of claim 1, wherein analyzing the IC layout comprises:
determining whether the IC layout violates one or more design rules.

13. The method of claim 12, wherein the IC layout is suitable even when it violates the one or more design rules and/or includes known bad patterns.

14. The method of claim 1, wherein analyzing the IC layout comprises:
determining whether the IC layout contains a known bad pattern.

15. The method of claim 14, wherein the IC layout is suitable even when it includes the known bad pattern.

16. The method of claim 1, wherein analyzing the IC layout comprises:
calculating a figure of merit based on information in the pattern library.

17. The method of claim 1, further comprising:
replacing a known bad pattern with a known good pattern.

18. The method of claim 1, further comprising:
replacing a known bad pattern with a pattern that does not violate a design rule.

19. The computer implemented method of claim 1, wherein the one or more exceptions comprise one or more specific disallowed exceptions which satisfy the fabrication rules, one or more specific allowed non-fabrication exceptions which do not satisfy one or more analysis rules, or one or more specific disallowed non-fabrication exceptions which satisfy at least some of the one or more analysis rules.

20. A computer-implemented method for designing a physical layout for an Integrated Circuit (IC), comprising:
using a computing system which comprises at least one processor to perform a process, the process comprising
receiving an IC design that specifies a desired function;
consulting an application-specific pattern library containing a known bad pattern that corresponds to one or more patterns in the IC design and statistical information;
performing statistical analysis based at least in part upon the known bad pattern and the statistical information associated with a probability that the known bad pattern will properly perform the desired function after manufacturing to generate a result to determine whether the IC design is suitable for manufacturing, wherein the act of performing statistical analysis determines an impact on a component in the IC design caused by at least one non-neighboring circuit component, which is not neighboring the component and comprises:
producing a physical layout based at least in part upon the result of the statistical analysis of the IC design, wherein the physical layout does not include the known bad pattern, and the known bad pattern is based at least in part upon one or more criteria specific to the desired function; and
storing the physical layout in a volatile or non-volatile computer-usable medium or displaying the physical layout on a display device.

21. The method of claim 20, wherein producing a physical layout comprises:
generating a plurality of possible physical layouts based on the IC design; and
selecting, from the plurality of possible physical layouts, a physical layout that does not include the known bad pattern.

22. The method of claim 21, wherein selecting a physical layout comprises:
selecting a physical layout that does not violate one or more design rules.

23. The method of claim 21, wherein selecting a physical layout comprises:
calculating a figure of merit based on information in the pattern library.

24. The method of claim 20, wherein consulting the pattern library comprises:
matching a pattern in a first one of the possible IC layouts to the known bad pattern.

25. The method of claim 24, wherein matching is exact.

26. The method of claim 24, wherein the matching is approximate.

27. The method of claim 26, wherein the matching comprises:
   determining a number of pixels that match between the pattern in the first possible IC layout and the pattern in the library; and
   determining whether the number of pixels exceeds a minimum threshold.

28. The method of claim 26, wherein the matching comprises:
   determining the displacement of edges and corners required to make the pattern in the IC layout to exactly match the pattern in the pattern library.

29. The method of claim 28, wherein the matching further comprises:
   determining whether a maximum displacement exceeds a predetermined minimum threshold.

30. The method of claim 28, wherein the matching further comprises:
   determining whether an average displacement exceeds a predetermined minimum threshold.

31. The method of claim 26, wherein matching comprises:
   analyzing the pattern in the IC layout and the pattern in the pattern library to determine whether they would be manufactured in a substantially similar fashion.

32. The method of claim 20, wherein the pattern library comprises a fabrication pattern library.

33. The method of claim 20, wherein the pattern library comprises an application-specific pattern library.

34. A system for analyzing suitability of an Integrated Circuit (IC) layout for manufacture, comprising:
   a computer system that comprises at least one processor and is configured for performing:
   receiving an IC layout;
   performing design rules checking (DRC) using design rules on the IC layout to generate a DRC result;
   consulting a pattern library, wherein
      the pattern library comprises at least a pattern that corresponds to one or more patterns in the IC layout and statistics associated with a probability that the pattern will function as designed after manufacturing;
   analyzing the IC layout based at least in part upon the DRC result and the pattern to determine one or more exceptions to the design rules, wherein
      the act of analyzing the IC layout comprises determining an impact on a component of the IC layout caused by at least one non-neighboring circuit component, which is not neighboring the component; and
   making a determination, based at least in part upon the means for analyzing the IC layout and the pattern, of the suitability of the IC layout for manufacture, wherein the means for making the determination comprises:
      performing statistical analysis by using at least in part the one or more exceptions to the design rules and the statistics from the pattern library associated with the probability that the pattern will function as designed after manufacturing to determine whether the manufactured IC layout is suitable for manufacturing.

35. The system of claim 34, wherein the IC layout is suitable even when it violates the one or more design rules and/or includes known bad patterns.

36. A computer program module comprising a non-transitory computer-usable medium storing a computer program comprising instructions which, when executed by a processor, cause the processor to perform a process for analyzing suitability of an Integrated Circuit (IC) layout for manufacture, the process comprising:
   receiving an IC layout;
   performing design rules checking (DRC) using design rules on the IC layout to generate a DRC result;
   consulting a pattern library, wherein
      the pattern library comprises at least a pattern that corresponds to one or more patterns in the IC layout and statistics associated with a probability that the pattern will function as designed after manufacturing;
   analyzing the IC layout based at least in part upon the DRC result and the pattern to determine one or more exceptions to the design rules, wherein
      the act of analyzing the IC layout comprises determining an impact on a component in the IC layout caused by at least one non-neighboring circuit component, which is not neighboring the component; and
   making a determination, based at least in part upon the act of analyzing the IC layout and the pattern, of the suitability of the IC layout for manufacture, wherein the act of making the determination comprises:
      performing statistical analysis by using at least in part the one or more exceptions- and the statistics to determine whether the manufactured IC layout is suitable for manufacturing.

37. The module of claim 36, wherein the IC layout is suitable even when it violates the one or more design rules and/or includes known bad patterns.

38. A system for designing a physical layout for an Integrated Circuit (IC), comprising:
   A computer system that comprises at least one processor and is configured for performing:
   receiving an IC design that specifies a desired function;
   consulting an application-specific pattern library containing a known bad pattern that corresponds to one or more patterns in the IC design and statistical information;
   performing statistical analysis based at least in part upon the known bad pattern and the statistical information associated with a probability that the known bad pattern will properly perform the desired function after manufacturing to generate a result to determine whether the IC design is suitable for manufacturing, wherein the processor configured for performing the statistical analysis is further configured for determining an impact on a component in the IC design caused by at least one non-neighboring circuit component, which is not neighboring the component; and
   producing a physical layout based at least in part upon the result of the statistical analysis of the IC design, wherein the physical layout does not include the known bad pattern, and the known bad pattern is based at least in part upon one or more criteria specific to the desired function.

39. The system of claim 38, wherein producing a physical layout comprises:
   generating a plurality of possible physical layouts based on the IC design; and
   selecting, from the plurality of possible physical layouts, a physical layout that does not include the known bad pattern.

40. A computer program module comprising a non-transitory computer-usable medium storing a computer program comprising instructions which, when executed by a processor, cause the processor to perform a method, the method comprising:
   receiving an IC design that specifies a desired function;
   consulting an application-specific pattern library containing a known bad pattern that corresponds to one or more patterns in the IC design and statistical information;

performing statistical analysis based at least in part upon the known bad pattern and the statistical information associated with a probability that the known bad pattern will properly perform the desired function after manufacturing to generate a result to determine whether the IC design is suitable for manufacturing, wherein the act of performing the statistical analysis determines an impact on a component in the IC design caused by at least one non-neighboring circuit component, which is not neighboring the component, and producing a physical layout based at least in part upon the result of the statistical analysis of the IC design, wherein the physical layout does not include the known bad pattern, and the known bad pattern is based at least in part upon one or more criteria specific to the desired function.

41. The module of claim 40, wherein producing a physical layout comprises:

generating a plurality of possible physical layouts based on the IC design; and selecting, from the plurality of possible physical layouts, a physical layout that does not include the known bad pattern.

* * * * *